US 11,373,893 B2

(12) United States Patent
Sarode Vishwanath et al.

(10) Patent No.: US 11,373,893 B2
(45) Date of Patent: Jun. 28, 2022

(54) CRYOGENIC ELECTROSTATIC CHUCK

(71) Applicant: Applied Materials, Inc., Santa Clara, CA (US)

(72) Inventors: Yogananda Sarode Vishwanath, Bangalore (IN); Steven E. Babayan, Los Altos, CA (US); Stephen Donald Prouty, San Jose, CA (US); Alvaro Garcia De Gorordo, Mountain View, CA (US); Andreas Schmid, Meyriez (CH); Andrew Antoine Noujaim, Morgan Hill, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/997,300

(22) Filed: Aug. 19, 2020

(65) Prior Publication Data
US 2021/0082730 A1      Mar. 18, 2021

Related U.S. Application Data

(60) Provisional application No. 62/900,810, filed on Sep. 16, 2019.

(51) Int. Cl.
*H01L 21/683* (2006.01)
*H01J 37/32* (2006.01)

(52) U.S. Cl.
CPC .... *H01L 21/6833* (2013.01); *H01J 37/32724* (2013.01)

(58) Field of Classification Search
CPC .......... H01L 21/6831; H01L 21/67103; H01L 21/67109; H01L 21/6833; H01L 21/67126;

(Continued)

(56) References Cited

U.S. PATENT DOCUMENTS

| 6,219,219 B1 | 4/2001 | Hausmann et al. |
| 6,328,096 B1 * | 12/2001 | Stone ................ H01L 21/67103 |
| | | 118/728 |

(Continued)

FOREIGN PATENT DOCUMENTS

| JP | 2012142413 A | 7/2012 |
| JP | 2017092267 A | 5/2017 |
| WO | 2014150242 A1 | 9/2014 |

OTHER PUBLICATIONS

International Search Report/Written Opinion Issued to PCT/US2020/047244 dated Dec. 2, 2020.

*Primary Examiner* — Kevin J Comber
(74) *Attorney, Agent, or Firm* — Patterson + Sheridan LLP

(57) ABSTRACT

Embodiments described herein relate to a substrate support assembly which enables a cryogenic temperature operation of an electrostatic chuck (ESC) so that a substrate disposed thereon is maintained at a cryogenic processing temperature suitable for processing while other surfaces of a processing chamber are maintained at a different temperature. The substrate support assembly includes an electrostatic chuck (ESC), an ESC base assembly coupled to the ESC having a base channel disposed therein, and a facility plate having a facility channel disposed therein. The facility plate includes a plate portion and a wall portion. The plate portion is coupled to the ESC base assembly and the wall portion coupled to the ESC with a seal assembly. A vacuum region is defined by the ESC, the ESC base assembly, the plate portion of the facility plate, the wall portion of the facility plate, and the seal assembly.

20 Claims, 10 Drawing Sheets

(58) Field of Classification Search
CPC .......... H01L 21/68735; H01L 21/67248; H01J 37/32724
USPC .......................................................... 361/234
See application file for complete search history.

(56) References Cited

U.S. PATENT DOCUMENTS

| | | | |
|---|---|---|---|
| 6,558,508 B1 | 5/2003 | Kawakami | |
| 6,949,722 B2 | 9/2005 | Strang et al. | |
| 7,161,121 B1 | 1/2007 | Steger | |
| 7,230,204 B2 | 6/2007 | Mitrovic et al. | |
| 7,651,583 B2 | 1/2010 | Kent et al. | |
| 8,007,591 B2 | 8/2011 | Hamelin | |
| 9,779,955 B2 | 10/2017 | Lill et al. | |
| 10,283,398 B2 | 5/2019 | Tanaka et al. | |
| 2002/0014894 A1 | 2/2002 | Yonezawa et al. | |
| 2003/0047551 A1* | 3/2003 | Worm | H01L 21/67248 219/390 |
| 2006/0144516 A1* | 7/2006 | Ricci | H01L 21/6831 156/345.27 |
| 2008/0217293 A1 | 9/2008 | Iimuro | |
| 2010/0122774 A1 | 5/2010 | Makabe et al. | |
| 2012/0091108 A1* | 4/2012 | Lin | H01L 21/67109 219/201 |
| 2013/0088808 A1* | 4/2013 | Parkhe | H01L 21/6833 361/234 |
| 2013/0240759 A1* | 9/2013 | Krampert | H01J 37/3171 250/492.3 |
| 2014/0034239 A1 | 2/2014 | Yang et al. | |
| 2014/0073066 A1* | 3/2014 | Tabuchi | H01J 37/32724 438/5 |
| 2014/0334060 A1* | 11/2014 | Parkhe | H01L 21/6833 361/234 |
| 2017/0133245 A1* | 5/2017 | Iizuka | H01L 21/67069 |
| 2018/0076048 A1 | 3/2018 | Gohira et al. | |
| 2018/0197761 A1 | 7/2018 | Ferrara et al. | |
| 2018/0211822 A1 | 7/2018 | Gohira et al. | |
| 2018/0211824 A1 | 7/2018 | Kudo et al. | |
| 2018/0247826 A1 | 8/2018 | Nakaya et al. | |
| 2018/0350561 A1 | 12/2018 | Yamaguchi et al. | |
| 2019/0027345 A1 | 1/2019 | Ishikawa et al. | |
| 2019/0035609 A1 | 1/2019 | Tobe | |
| 2020/0185248 A1 | 6/2020 | Sarode Vishwanath et al. | |

* cited by examiner

CRYOGENIC ELECTROSTATIC CHUCK

BACKGROUND

Field

Embodiments of the present disclosure generally relate to semiconductor manufacturing and more particularly to a substrate support assembly enabling a cryogenic temperature operation of an electrostatic chuck (ESC).

Description of the Related Art

Reliably producing nanometer and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

To drive down manufacturing cost, integrated chip (IC) manufactures demand higher throughput and better device yield and performance from every silicon substrate processed. Some fabrication techniques being explored for next generation devices under current development require processing at cryogenic temperatures. Dry reactive ion etching a substrate uniformly maintained at a cryogenic temperature enables ions to bombard the upward facing surfaces of materials disposed on the substrate with decreased spontaneous etching so that trenches with smooth, vertical sidewalls are formed. Additionally, selectivity of etching one material versus another can be improved at the cryogenic temperature. For example, selectivity between silicon (Si) and silicon dioxide ($SiO_2$) increases exponentially as temperature is decreased.

Thus, there is a need for an improved substrate support assembly suitable for use with cryogenic temperatures.

SUMMARY

In one embodiment, a substrate support assembly is provided. The substrate support assembly includes an electrostatic chuck (ESC) having a support surface and a bottom surface opposite the support surface. The ESC has a chucking electrode and one or more resistive heaters disposed therein. An ESC base assembly is coupled to the ESC having a base channel disposed therein. A facility plate has a facility channel disposed therein. The facility plate includes a plate portion and a wall portion. The plate portion is coupled to the ESC base assembly and the wall portion coupled to the ESC with a seal assembly. A vacuum region is defined by the ESC, the ESC base assembly, the plate portion of the facility plate, the wall portion of the facility plate, and the seal assembly.

In another embodiment, a substrate support assembly is provided. The substrate support assembly includes an electrostatic chuck (ESC) having a support surface and a bottom surface opposite the support surface. The ESC has a chucking electrode and one or more resistive heaters disposed therein. An ESC base assembly is coupled to the ESC having a base channel disposed therein. The base channel has a base inlet in fluid communication with a jacketed base inlet tube disposed through a facility plate, an insulator plate coupled to the facility plate, and a ground plate coupled to the insulator plate. The base channel has a base outlet in fluid communication with a jacketed base outlet tube disposed through the facility plate, the insulator plate, and the ground plate. The facility plate includes a plate portion and a wall portion. The plate portion is coupled to the ESC base assembly with one or more first screw assemblies and the wall portion is coupled to the ESC with a seal assembly. The facility plate has a facility channel disposed therein. The seal assembly includes a polytetrafluoroethylene (PTFE) body having a helical spring disposed therein. A vacuum region is defined by the ESC, the ESC base assembly, the plate portion of the facility plate, the wall portion of the facility plate, and the seal assembly.

In yet another embodiment, a process chamber is provided. The process chamber includes a chamber body having walls and a lid defining a processing region. A substrate support assembly is disposed in the processing region. The substrate support assembly includes an electrostatic chuck (ESC) having a support surface and a bottom surface opposite the support surface. The ESC has a chucking electrode and one or more resistive heaters disposed therein. An ESC base assembly is coupled to the ESC having a base channel disposed therein. A facility plate has a facility channel disposed therein. The facility plate includes a plate portion and a wall portion. The plate portion is coupled to the ESC base assembly and the wall portion is coupled to the ESC with a seal assembly. A vacuum region is defined by the ESC, the ESC base assembly, the plate portion of the facility plate, the wall portion of the facility plate, and the seal assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a substrate support assembly which enables a cryogenic temperature operation of an electrostatic chuck (ESC) so that a substrate disposed thereon is maintained at a cryogenic processing temperature suitable for processing while other surfaces of a processing chamber are maintained at a different temperature. The cryogenic processing temperature (i.e., temperature of the substrate) is intended to refer to temperatures less than −20 degrees Celsius.

Although the substrate support assembly is described below in an etch processing chamber, the substrate support assembly may be utilized in other types of plasma processing chambers, such as physical vapor deposition chambers, chemical vapor deposition chambers, ion implantation chambers, among others, and other systems where processing necessitates a substrate maintained at the cryogenic processing temperature.

Figure 1:
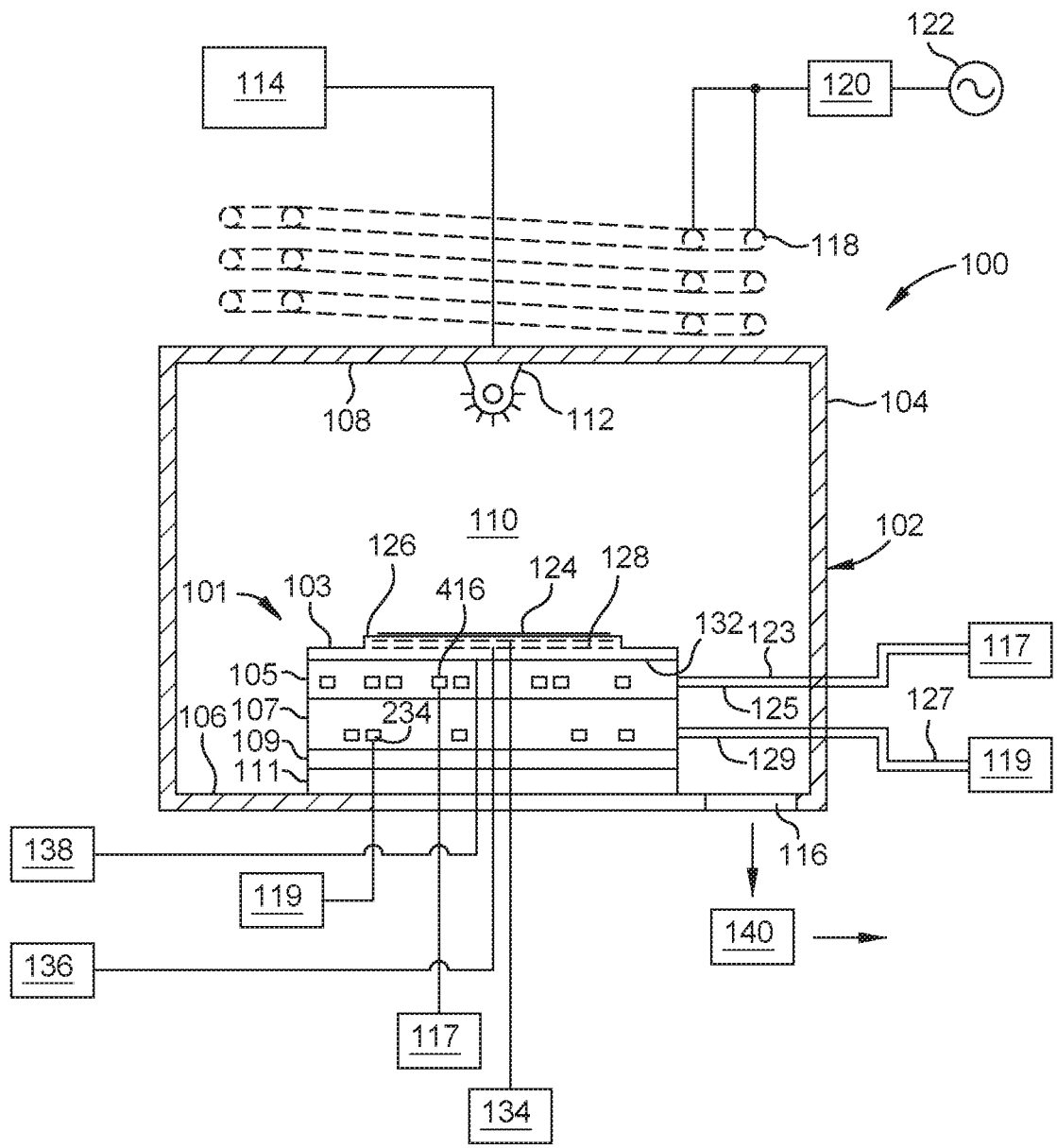
FIG. 1 is a cross-sectional schematic view of an exemplary plasma processing chamber according to an embodiment.

FIG. 1 is a cross-sectional schematic view of an exemplary plasma processing chamber 100, shown configured as an etch chamber, having a substrate support assembly 101. The substrate support assembly 101 may be utilized in other types of plasma processing chambers, for example plasma treatment chambers, annealing chambers, physical vapor deposition chambers, chemical vapor deposition chambers, and ion implantation chambers, among others, as well as other systems where the ability to uniformly maintain a surface or workpiece, such as a substrate 124, at a cryogenic processing temperature is desirable. Dry reactive ion etching a substrate 124 maintained at a cryogenic processing temperature enables ions to bombard the upward facing surfaces of materials disposed on the substrate 124 with decreased spontaneous etching so that trenches with smooth, vertical sidewalls are formed. For example, diffusion of ions in porosities of a low-k dielectric material disposed on the substrate 124 uniformly maintained at the cryogenic processing temperature is decreased while ions continue to bombard the upward facing surface of the low-k dielectric material to form trenches with smooth, vertical sidewalls. Additionally, selectivity of etching one material versus another can be improved at the cryogenic processing temperature. For example, selectivity between silicon (Si) and silicon dioxide ($SiO_2$) increases exponentially as temperature is decreased.

The plasma processing chamber 100 includes a chamber body 102 having sidewalls 104, a bottom 106 and a lid 108 that enclose a processing region 110. An injection apparatus 112 is coupled to the sidewalls 104 and/or lid 108 of the chamber body 102. A gas panel 114 is coupled to the injection apparatus 112 to allow process gases to be provided into the processing region 110. The injection apparatus 112 may be one or more nozzle or inlet ports, or alternatively a showerhead. Process gases, along with any processing by-products, are removed from the processing region 110 through an exhaust port 116 formed in the sidewalls 104 or bottom 106 of the chamber body 102. The exhaust port 116 is coupled to a pumping system 140, which includes throttle valves and pumps utilized to control the vacuum levels within the processing region 110.

The process gases may be energized to form a plasma within the processing region 110. The process gases may be energized by capacitively or inductively coupling RF power to the process gases. In the embodiment, which can be combined with other embodiments described herein, depicted in FIG. 1, a plurality of coils 118 are disposed above the lid 108 of the plasma processing chamber 100 and coupled through a matching circuit 120 to an RF power source 122.

The substrate support assembly 101 is disposed in the processing region 110 below the injection apparatus 112. The substrate support assembly 101 includes an ESC 103 and an ESC base assembly 105. The ESC base assembly 105 is coupled to the ESC 103 and a facility plate 107. The facility plate 107 supported by a ground plate 111 is configured to facilitate electrical, cooling, heating, and gas connections with the substrate support assembly 101. The ground plate 111 is supported by the bottom 106 of the processing chamber. An insulator plate 109 insulates the facility plate 107 from the ground plate 111.

The ESC base assembly 105 includes a base channel 416 (shown in FIGS. 4A-4D) coupled to a cryogenic chiller 117. In one embodiment, which can be combined with other embodiments described herein, the cryogenic chiller 117 is in fluid communication with the base channel 416 via a base inlet conduit 123 connected to an inlet 254 (shown in FIGS. 2A and 2B) of the base channel 416 and via a base outlet conduit 125 connected to an outlet 256 (shown in FIGS. 2A and 2B) of the base channel 416 such that the ESC base assembly 105 is maintained at a predetermined cryogenic temperature. In one embodiment, which can be combined with other embodiments described herein, the cryogenic chiller 117 is coupled to an interface box to control a flow rate of a base fluid. The base fluid may include a material that can maintain a cryogenic temperature less than −50 degrees Celsius. The cryogenic chiller 117 provides the base fluid, which is circulated through the base channel 416 of the ESC base assembly 105. The base fluid flowing through the base channel 416 enables the ESC base assembly 105 to be maintained at the cryogenic temperature, which assists in controlling the lateral temperature profile of the ESC 103 so that a substrate 124 disposed on the ESC 103 is uniformly maintained at the cryogenic processing temperature. In one embodiment, which can be combined in other embodiments described herein, the cryogenic chiller 117 is a single-stage chiller operable to maintain the cryogenic temperature less than about −50 degrees Celsius. In another embodiment, which can be combined in other embodiments described herein, the cryogenic chiller 117 is a two-stage chiller that utilizes refrigerant internal to the two-stage chiller such the base fluid is maintained at the cryogenic temperature less than −50 degrees Celsius.

The facility plate 107 includes a facility channel 234 (shown in FIGS. 2A and 2B) coupled to a chiller 119. The chiller 119 is in fluid communication with the facility channel 234 via a facility inlet conduit 127 connected to an inlet 240 (shown in FIGS. 2A and 2B) of the facility channel 234 and via a facility outlet conduit 129 connected to an outlet 242 (shown in FIGS. 2A and 2B) of the facility channel 234 such that the facility plate 107 is maintained a predetermined ambient temperature. In one embodiment, which can be combined with other embodiments described herein, the cryogenic chiller 117 is coupled to an interface box to control a flow rate of the facility fluid. The facility fluid may include a material that can maintain an ambient temperature between about −10 degrees Celsius to about 60 degrees Celsius. The chiller 119 provides the facility fluid, which is circulated through the facility channel 234 of the facility plate 107. The facility fluid flowing through the facility channel 234 enables the facility plate 107 to be maintained at the predetermined ambient temperature, which assists in maintaining the insulator plate 109 at the predetermined ambient temperature.

The ESC 103 has a support surface 130 and a bottom surface 132 opposite the support surface 130. In one embodiment, which can be combined with other embodiments described herein, the ESC 103 is fabricated from a ceramic material, such as alumina ($Al_2O_3$), aluminum nitride (AlN) or other suitable material. Alternately, the ESC 103 may be fabricated from a polymer, such as polyimide, polyetheretherketone, polyaryletherketone and the like.

The ESC 103 includes a chucking electrode 126 disposed therein. The chucking electrode 126 may be configured as a mono polar or bipolar electrode, or other suitable arrangement. The chucking electrode 126 is coupled through an RF filter and the facility plate 107 to a chucking power source 134, which provides a DC power to electrostatically secure the substrate 124 to the support surface 130 of the ESC 103. The RF filter prevents RF power utilized to form a plasma (not shown) within the plasma processing chamber 100 from damaging electrical equipment or presenting an electrical hazard outside the chamber.

The ESC 103 includes one or more resistive heaters 128 embedded therein. The resistive heaters 128 are utilized to elevate the temperature of the ESC 103 to the cryogenic processing temperature suitable for processing a substrate 124 disposed on the support surface 130. The resistive heaters 128 are coupled through the facility plate 107 and an RF filter to a heater power source 136. The RF filter prevents RF power utilized to form a plasma (not shown) within the plasma processing chamber 100 from damaging electrical equipment or presenting an electrical hazard outside the chamber. The heater power source 136 may provide 500 watts or more power to the resistive heaters 128. The heater power source 136 includes a controller (not shown) utilized to control the operation of the heater power source 136, which is generally set to heat the substrate 124 to a predetermined cryogenic temperature. In one embodiment, which can be combined with other embodiments described herein, the resistive heaters 128 include a plurality of laterally separated heating zones, wherein the controller enables at least one zone of the resistive heaters 128 to be preferentially heated relative to the resistive heaters 128 located in one or more of the other zones. For example, the resistive heaters 128 may be arranged concentrically in a plurality of separated heating zones. The resistive heaters 128 maintain the substrate 124 at a cryogenic processing temperature suitable for processing. In one embodiment, which can be combined with other embodiments described herein, the cryogenic processing temperature is less than about –20 degrees Celsius. For example, the cryogenic processing temperature is between about –20 degrees Celsius to about –150 degrees Celsius.

Figure 5A:
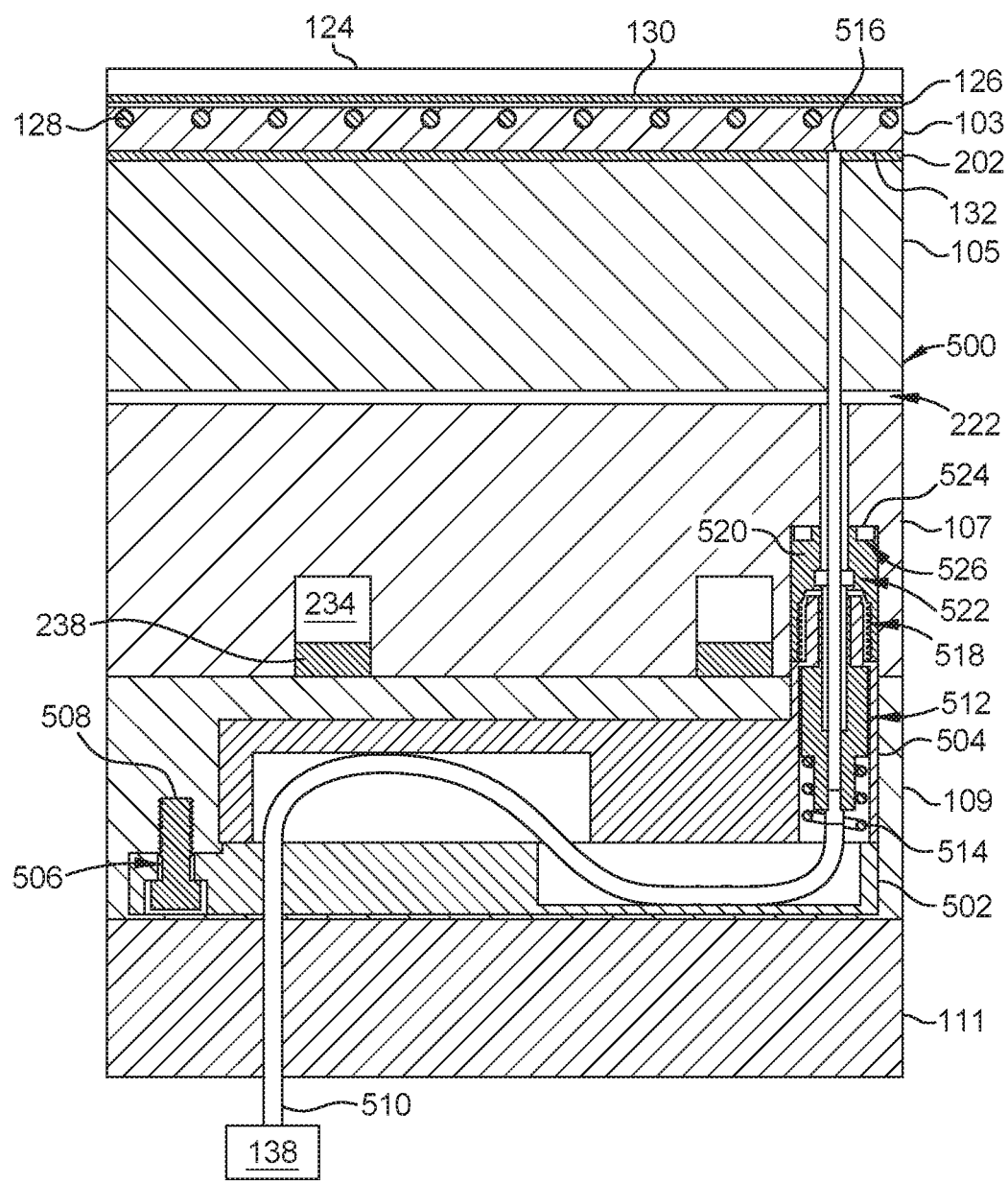
FIG. 5A-5C are sectional, cross-sectional schematic views of an exemplary substrate support assembly according to embodiments.
Figure 5B:
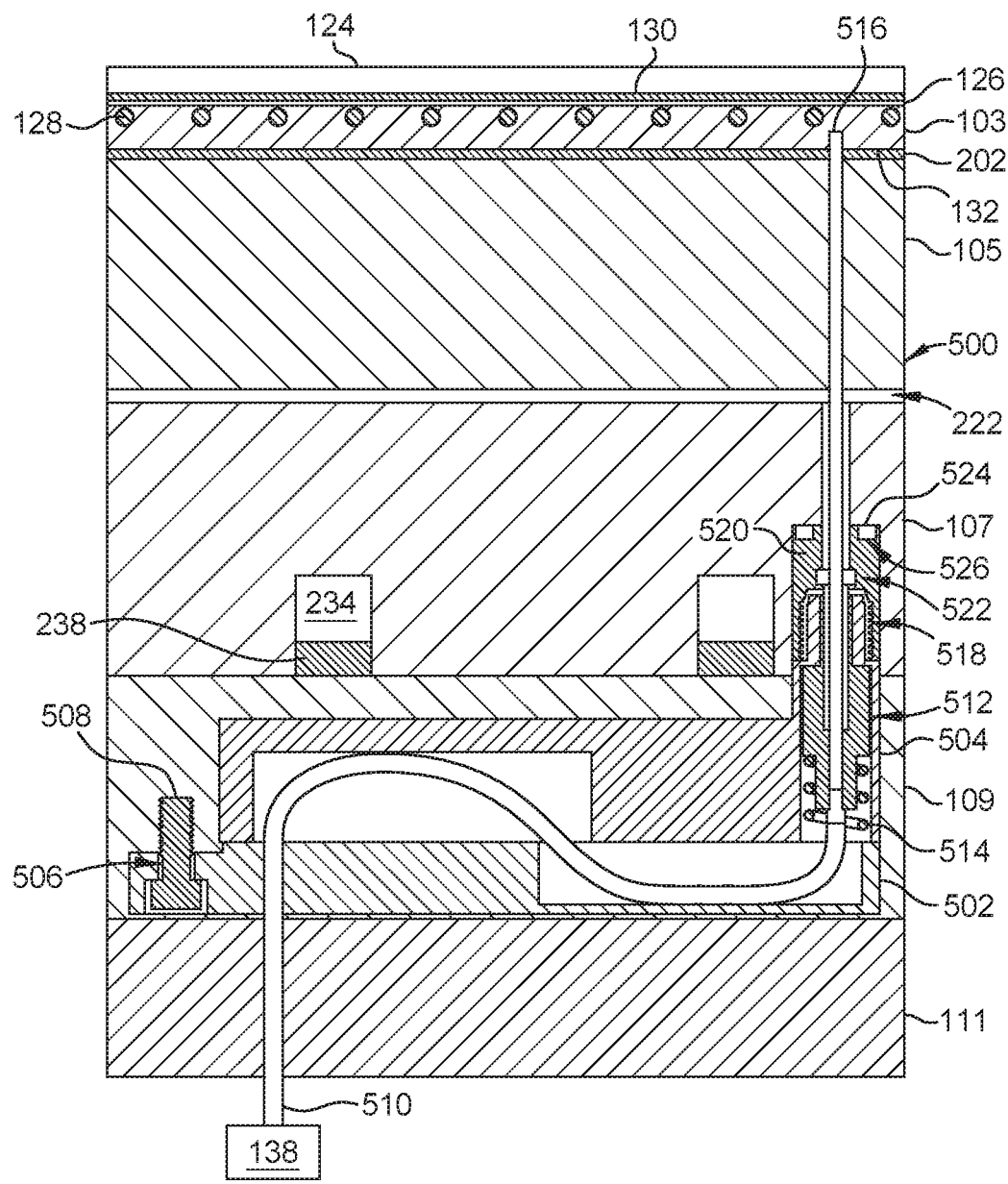
Figure 5C:
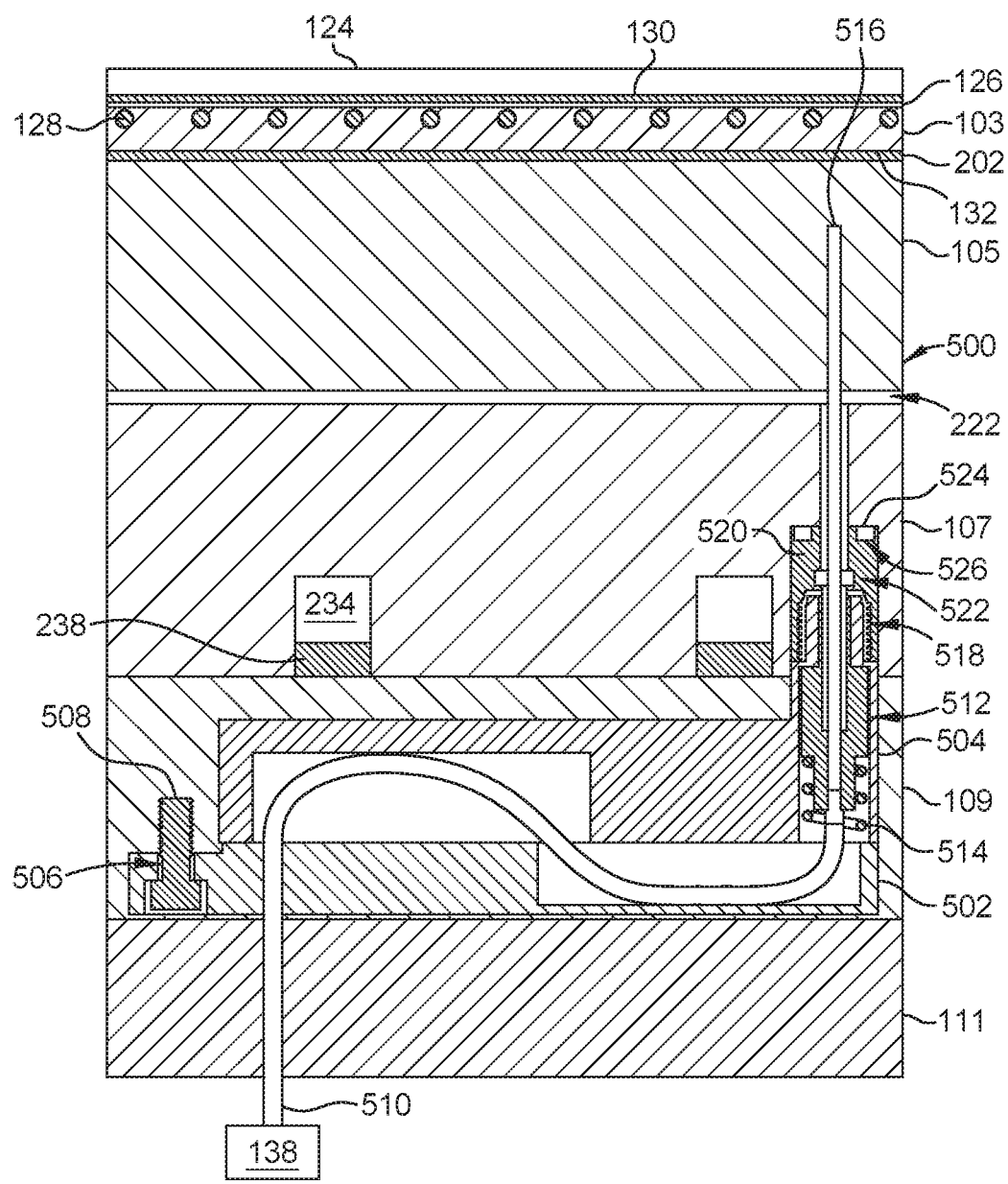

The substrate support assembly 101 may include one or more probes disposed therein. In one embodiment, which can be combined with other embodiments described herein, one or more low temperature optical probe assemblies 500 (shown in FIGS. 5A-5D) are coupled a probe controller 138. In one embodiment, which can be combined with other embodiments described herein, the probe tip 516 of each of low temperature optical probes 512 is disposed in (as shown in FIG. 5B) or at the surface of the ESC 103 (as shown in FIG. 5A) to determine the temperature of the ESC 103. In another embodiment, which can be combined with other embodiments described herein, probe tip 516 of each of low temperature optical probes 512 is disposed in (as shown in FIG. 5C) the ESC base assembly 105 to calibrate of the temperature of the substrate based on the temperature of the ESC base assembly 105. In one embodiment, which can be combined with other embodiments described herein, each of low temperature optical probe assemblies 500 corresponds to a zone of the plurality of laterally separated heating zones of the resistive heaters 128, wherein the low temperature optical probes measure the temperature of each zone of the ESC 103. The probe controller 138 is coupled to the heater power source 136 so that each zone of the resistive heaters 128 is independently heated for the lateral temperature profile of the ESC 103 to be substantially uniform based on temperature measurements so that a substrate 124 disposed on the ESC 103 is uniformly maintained at the cryogenic processing temperature.

Figure 2A:
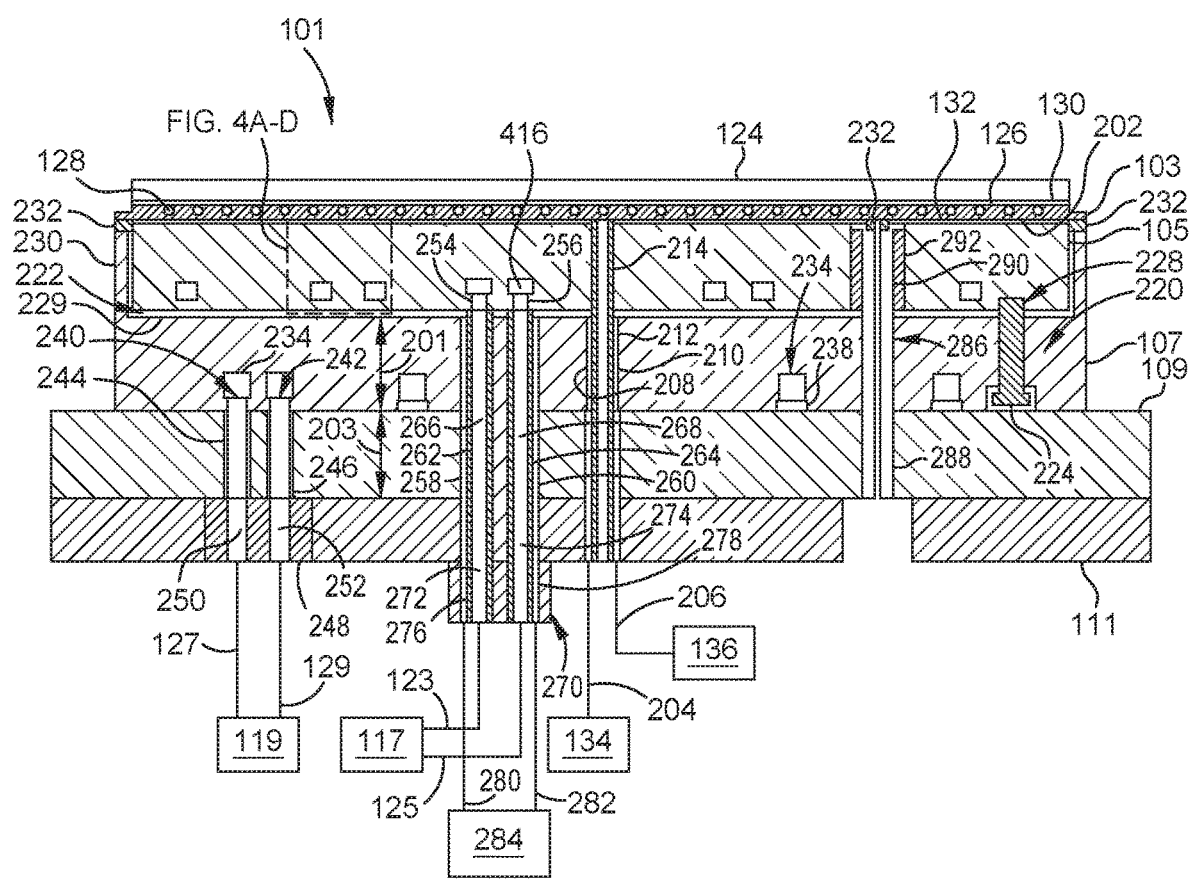
FIGS. 2A and 2B are cross-sectional schematic views of an exemplary substrate support assembly according to an embodiment.
Figure 2B:
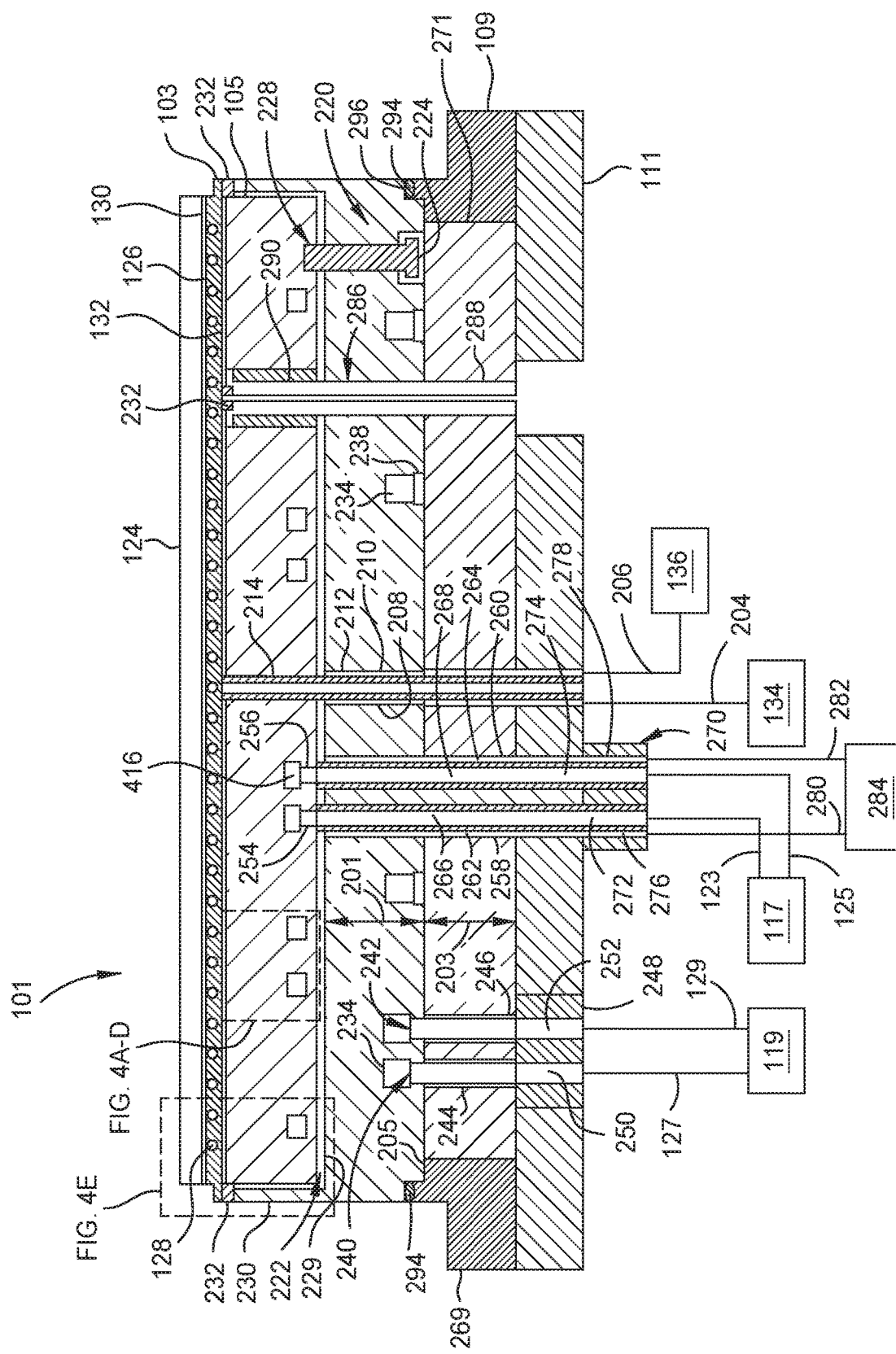

FIGS. 2A and 2B are cross-sectional schematic views of an exemplary substrate support assembly 101 enabling cryogenic temperature operation of ESC 103 so that a substrate 124 disposed thereon is maintained at the cryogenic processing temperature. The ESC 103 is coupled to the ESC base assembly 105. In one embodiment, which can be combined with other embodiments described herein, the ESC 103 is secured to the ESC base assembly 105 with a bonding layer 202. The bonding layer 202 may include organic or inorganic materials. In some embodiments, which may be combined with other embodiments described herein, the bonding layer 202 may include epoxy or metal materials. The chucking electrode 126 is coupled to the chucking power source 134 via a first insulated wire 204 disposed through a first bore 208 in a lower insulator 212 of the facility plate 107 and an upper insulator 214 of the ESC base assembly 105. The one or more resistive heaters 128 are coupled to the heater power source 136 via a second insulated wire 206 disposed through a second bore 210 in the lower insulator 212 of the facility plate 107 and the upper insulator 214 of the ESC base assembly 105.

Figure 2C:
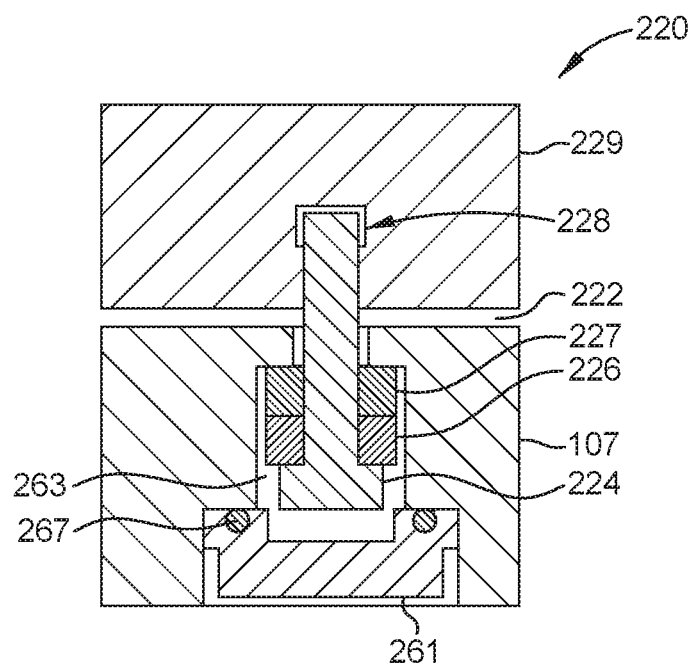
FIG. 2C is a schematic view of a screw assembly according to an embodiment.

The facility plate 107 includes a plate portion 229 and wall portion 230. The plate portion 229 of the facility plate 107 is coupled to the ESC base assembly 105 with one or more first screw assemblies 220 so that a vacuum region 222 is present between the ESC base assembly 105 and the facility plate 107. Each of the one or more first screw assemblies 220 includes a bolt 224 inserted through a thermal break 227 contacting the facility plate 107, one or more Belleville washers 226, and facility plate 107, and into a thread hole 228 of ESC base assembly 105. The thermal break 227 is in contact with the facility plate 107 to provide thermal isolation from the ESC base assembly 105 maintained at the cryogenic temperature. In one embodiment, which can be combined with other embodiments described herein, the thermal break 227 includes a polyamide-imide (PAI) or polyimide (PI) containing material. The one or more Belleville washers 226 and bolt 224 are preloaded such that the facility plate 107 is forced against the ESC base assembly 105. In some embodiments, as shown in FIG. 2C, a screw cover 261 is coupled to the facility plate 107 over the bolt 224 such that a vacuum insulation region 263 is maintained between each of the one or more first screw assemblies 220. The screw cover 261 is coupled to the facility plate 107 by an O-ring 267 to maintain the pressure in the vacuum insulation region 263 and to thermally insulate each of the one or more first screw assemblies 220 from the facility plate 107.

The facility plate 107 includes a wall portion 230 coupled to the ESC 103 by a seal assembly 232. In one embodiment, which can be combined with other embodiments described herein, the lower insulator 212 of the facility plate 107 maintains the vacuum region 222 via the seal assembly 232.

The wall coupled to the ESC by the seal assembly 232 protects the materials of the ESC base assembly 105 from potentially flaking off from contact with process gases. The vacuum region 222 is defined by the ESC 103, ESC base assembly 105, facility plate 107, and seal assembly 232. The vacuum region 222 prevents condensation on the backside of the cooling plate, prevents process gases from entering the substrate support assembly 101 by having a pressure independent of the pressure of the processing region 110, and provides for thermal isolation between the ESC base assembly 105 and facility plate 107. In one embodiment, which can be combined with other embodiments described herein, the facility plate 107 includes aluminum containing materials.

The facility channel 234 of the facility plate 107 is machined in the facility plate and welded with a cover 238. The inlet 240 of the facility channel 234 is in fluid communication with an inlet tube 244 disposed through the insulator plate 109 and the ground plate 111. The outlet 242 of the facility channel 234 is in fluid communication with an outlet tube 246 disposed through the insulator plate 109 and the ground plate 111. The inlet tube 244 and outlet tube 246 are connected to a connection 248 having a connection inlet 250 connected to the facility inlet conduit 127 and a connection outlet 252 connected to the facility outlet conduit 129. In one embodiment, which can be combined with other embodiments described herein, the connection 248, the inlet tube 244, and the outlet tube 246 may include insulating materials, such as ceramic containing materials.

The base channel 416 of the ESC base assembly 105, described in greater detail in FIGS. 4A-4D, includes an inlet 254 of the base channel 416 in fluid communication with an jacketed inlet tube 258 disposed through the facility plate 107, the insulator plate 109, and the ground plate 111. The outlet 256 of the base channel 416 is in fluid communication with a jacketed outlet tube 260 disposed through the facility plate 107, the insulator plate 109, and the ground plate 111. The jacketed inlet tube 258 and jacketed outlet tube 260 are connected to an interface block 270. In one embodiment, which can be combined with other embodiments described herein, the interface block 270, the jacketed inlet tube 258, and the jacketed outlet tube 260 include insulating materials, such as ceramic containing materials. The jacketed inlet tube 258 includes a fluid inlet channel 266 and a vacuum channel 262. The jacketed outlet tube 260 includes a fluid outlet channel 268 and a vacuum channel 264. The interface block 270 includes a base inlet 272, vacuum channel 276, base outlet 274, and vacuum channel 278. The base inlet 272 is connected to the base inlet conduit 123 and a base outlet 274 connected to the base outlet conduit 125. The vacuum channel 276 is connected to a vacuum conduit 280 in fluid communication with a vacuum source 284 and the vacuum channel 278 is connected to a vacuum conduit 282 in fluid communication with the vacuum source 284. Coupling the vacuum source 284 to the vacuum region 222 enables a pressure independent of the pressure of the processing region 110 to be maintained in the vacuum region 222. In one embodiment, which can be combined with other embodiments described herein, the fluid inlet channel 266 and the fluid outlet channel 268 are coupled to the ESC base assembly 105 by the seal assembly 232 to maintain the pressure in the vacuum region 222.

The substrate support assembly 101 also includes one or more lift pin assemblies 286 for accommodating lift pins (not shown) for elevating the substrate 124 above the support surface 130 of the ESC 103 to facilitate robotic transfer into and out of the plasma processing chamber 100.

Each of the one or more lift pin assemblies 286 includes a lift pin guide 288 disposed through the ESC 103, the ESC base assembly 105, the facility plate 107, the insulator plate 109, and the ground plate 111. A portion 290 of the lift pin guide 288 disposed through the ESC base assembly 105 is surrounded by a threaded bushing 292 holding the lift pin guide 288 in position. The lift pin guide 288 is coupled to the ESC 103 by the seal assembly 232 to maintain the chamber vacuum and insulation vacuum separate. In one embodiment, which can be combined with other embodiments described herein, the ESC 103 includes one or more gas passages for providing backside heat transfer gas, such as helium, to an interstitial space defined between the substrate 124 and the support surface 130 of the ESC 103. Each of the one or more one or more gas passages is disposed through the ESC 103, the ESC base assembly 105, the facility plate 107, the insulator plate 109, and the ground plate 111. Each of the one or more gas passages is coupled to the ESC 103 by the seal assembly 232 to maintain the pressure in the vacuum region 222.

As shown in FIG. 2B, the facility plate 107 includes a recessed portion 296 and a seal 294 disposed between the insulator plate 109 and the facility plate 107. A surface 205 of the insulator plate 109 coupled to the facility plate 107 is conformal the facility plate 107. The recessed portion 296 and the insulator plate 109 provide for a decreased thickness 201 of the facility plate 107 and an increased thickness 203 of the insulator plate 109. The decreased thickness 201 of the facility plate 107 and the increased thickness 203 of the insulator plate 109 reduces a length of the first insulated wire 204 disposed through the first bore 208 in the lower insulator 212 of the facility plate 107 and the length of the wire 204 disposed through the insulator plate 109. Reducing the length of the first insulated wire 204 disposed through the first bore 208 decreases arcing potential in the first bore 208 of the RF hot facility plate 107 from voltage provided to the first insulated wire 204 by chucking power source 134. In one embodiment, which can be combined with other embodiments described herein, an outer portion 269 of the insulator plate 109 includes materials different than the materials of the inner portion 271 of the insulator plate 109. The outer portion 269 may include aluminum oxide ($AlO_2$) containing materials and the inner portion 271 of the insulator plate 109 may include polystyrene containing materials.

Figure 3:
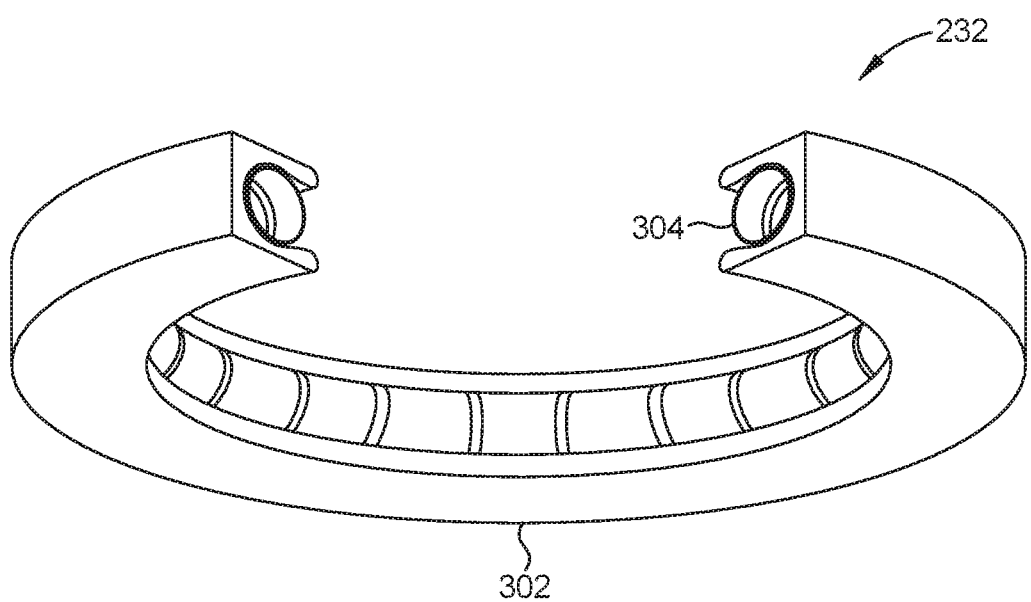
FIG. 3 is a schematic view of a seal assembly according to an embodiment.

FIG. 3 is a schematic view of the seal assembly 232 according to an embodiment. While FIG. 3 shows the seal assembly 232 as a face seal, embodiments described herein may include piston (i.e., radial) seals having a polytetrafluoroethylene (PTFE) body or metal seals. The seals described herein provide for sealing of the vacuum region 222 at a temperature between about −260 degrees Celsius to about 290 degrees Celsius. The seal assembly 232, shown in FIG. 3, includes a PTFE body 302 having a spring 304 disposed therein. In one embodiment, which can be combined with other embodiments described herein, the spring 304 includes stainless steel, nickel alloy, nickel-chromium alloy, and cobalt-chromium-nickel-molybdenum alloy containing materials. The seal assembly 232 allows for sealing of the ESC 103 at cryogenic temperatures. The PTFE body 302 having a spring disposed therein is operable at a temperature between about −260 degrees Celsius to about 290 degrees Celsius.

Figure 4A:
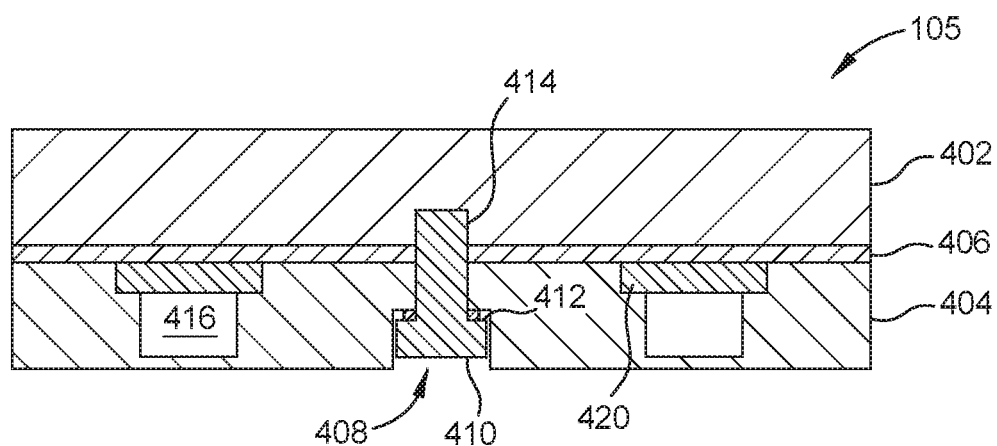
FIGS. 4A-4D are cross-sectional schematic views of an ESC base assembly according to embodiments.
Figure 4B:
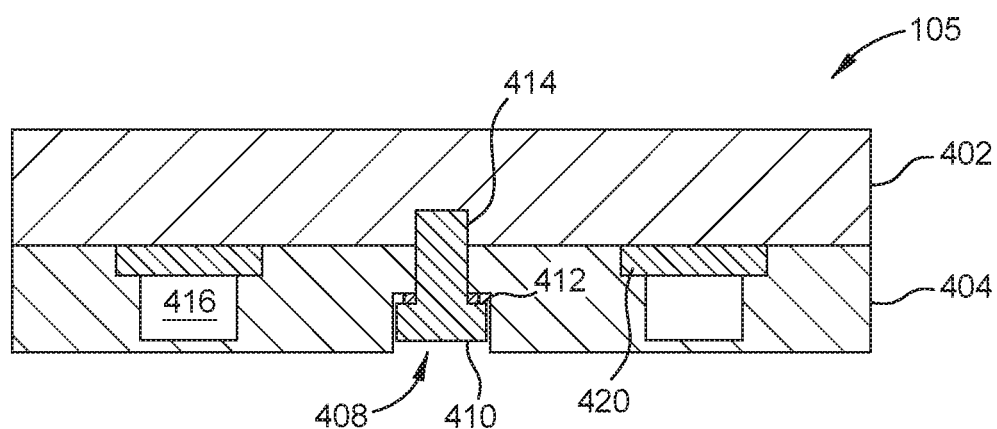

FIGS. 4A and 4B are cross-sectional schematic views of the ESC base assembly 105 having an ESC base 402 coupled to a base channel plate 404. The ESC base 402 includes materials to substantially match the coefficient of thermal expansion of the ESC 103. The ESC base 402 may include molybdenum or carbon fiber containing materials. In one embodiment, which can be combined with other embodiments described herein, the base channel plate 404 consists of aluminum containing materials. The base channel plate 404 includes the base channel 416 of the ESC base assembly 105. The base channel 416 is machined in the base channel plate 404 and bonded, welded, or brazed with a cover 420. The inlet 254 of the base channel 416 is in fluid communication with the jacketed inlet tube 258 and the outlet 256 of the base channel 416 is in fluid communication with the jacketed outlet tube 260. The ESC base 402 is coupled to the base channel plate 404 via one or more second screw assemblies 408. In one embodiment, as shown in FIG. 4A, the ESC base 402 is coupled to the base channel plate 404 with a thermal conductive gasket 406 therebetween to maintain a defined thermal conductivity between the ESC base 402 and the base channel plate 404. In another embodiment, as shown in FIG. 4B, a thermal conductive gasket 406 is not included. Each of the one or more second screw assemblies 408 includes a bolt 410 inserted through one or more Belleville washers 412 and ESC base 402, and into a thread hole 414 of ESC base 402. The one or more Belleville washers 412 and bolt 410 are preloaded such that the base channel plate 404 is forced against the ESC base 402.

Figure 4C:
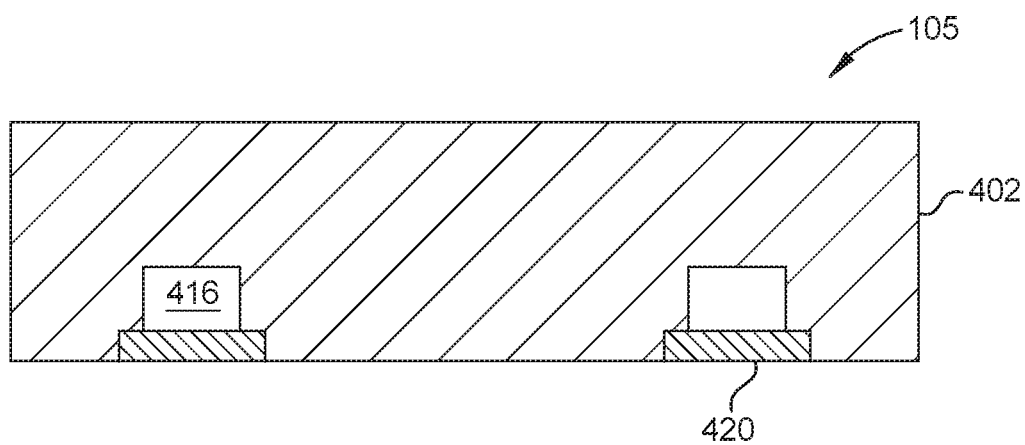

FIG. 4C is a cross-sectional schematic view of the ESC base assembly 105 having an ESC base 402 with the base channel 416. The ESC base 402 includes molybdenum or carbon fiber containing materials to substantially match the coefficient of thermal expansion of the ESC 103. The base channel 416 is machined in the ESC base 402 and bonded, welded, or brazed with a cover 420. The inlet 254 of the base channel 416 is in fluid communication with the jacketed inlet tube 258 and the outlet 256 of the base channel 416 is in fluid communication with the jacketed outlet tube 260.

Figure 4D:
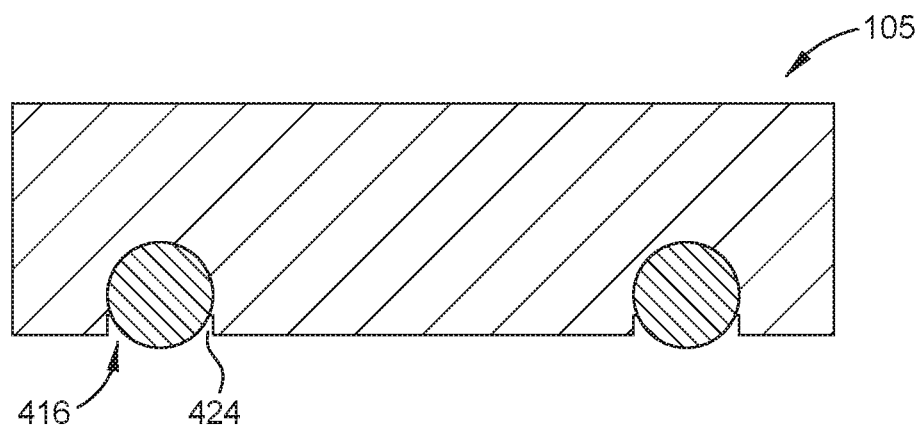

FIG. 4D is a cross-sectional schematic view of the ESC base assembly 105 having an ESC base 402 with the base channel 416. The ESC base 402 includes molybdenum or carbon fiber containing materials to substantially match the coefficient of thermal expansion of the ESC 103. The base channel 416 is a coil disposed in a space 424 machined in the ESC base 402. The inlet 254 of the base channel 416 is in fluid communication with the jacketed inlet tube 258 and the outlet 256 of the base channel 416 is in fluid communication with the jacketed outlet tube 260.

Figure 4E:
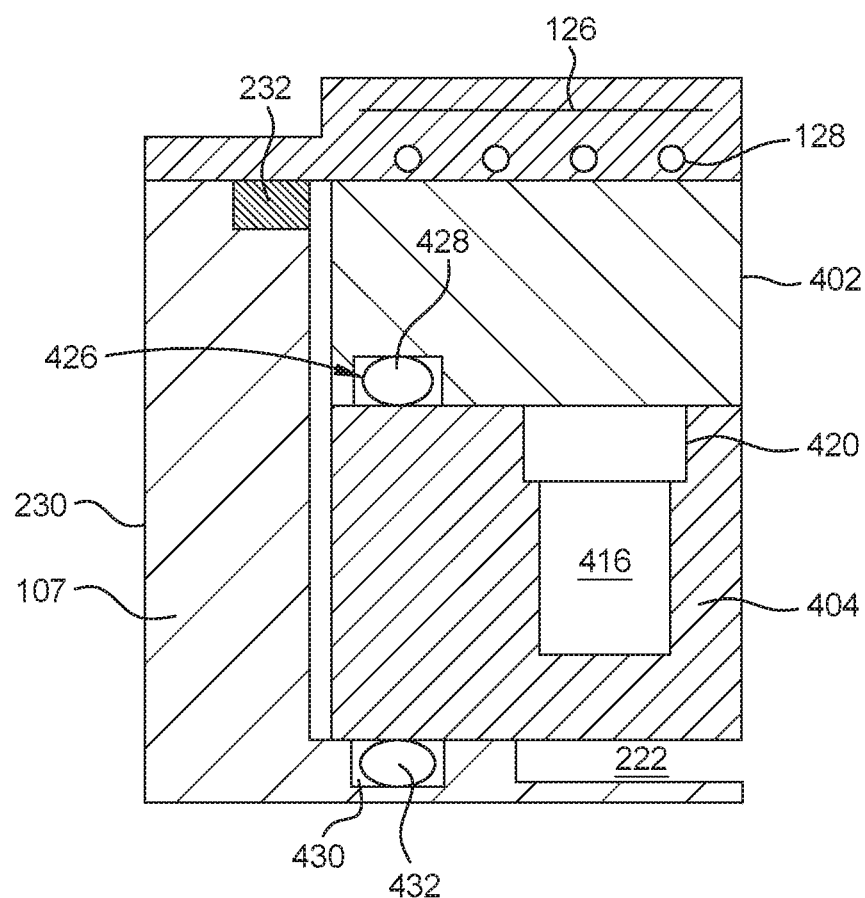
FIG. 4E is a cross-sectional schematic view of a perimeter portion of an exemplary substrate support assembly according to an embodiment.

FIG. 4E is a cross-sectional schematic view of a perimeter portion of the substrate support assembly 101 of FIG. 2B. The ESC base 402 includes a groove 426 exposed to the vacuum region 222. The groove 426 includes a RF gasket 428 disposed therein. The plate portion 229 of the facility plate 107 includes a groove 430 with a RF gasket 432 disposed therein. While the ESC base 402 and base channel plate 404 are thermally isolated from the facility plate 107, the RF gasket 432 maintains RF connectivity between the base channel plate 404 and the facility plate 107. Similarly, while the ESC base 402 and base channel plate 404 may be thermally conducting by the thermal interface 406 in the embodiment shown in FIG. 4A and FIG. 4E, the RF gasket 428 maintains an electrical, RF connectivity between the base channel plate 404 and the ESC base 402.

Figure 5D:
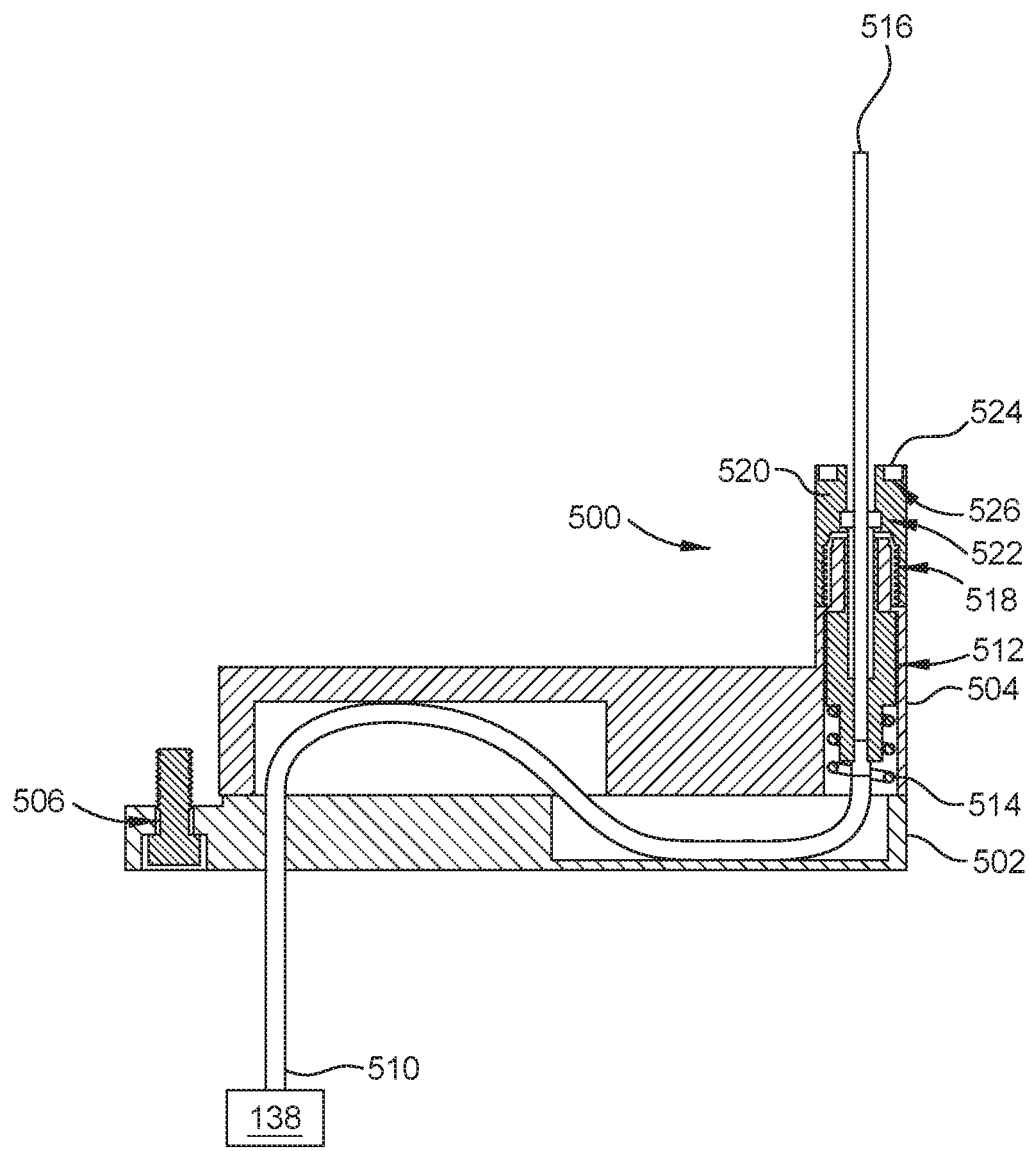
FIG. 5D is a cross-sectional schematic view of a low temperature optical probe assembly according to an embodiment.

FIGS. 5A-5C are schematic cross-sectional schematic view of an exemplary substrate support assembly 101 having one of the one or more low temperature optical probe assemblies 500 (shown in FIG. 5D). Each of the low temperature optical probe assemblies 500 includes an optical fiber 510 connected to the probe controller 138. Each of the low temperature optical probe assemblies 500 includes a mount housing 502 disposed in the insulator plate 109 and a probe housing 504 disposed in the insulator plate 109 and facility plate 107. The mount housing 502 is coupled to the probe housing 504 with a probe mounting bolt 506 inserted through the mount housing 502 and into a thread hole 508 of the insulator plate 109 so that the probe assembly 500 is forced against the facility plate 107. The optical fiber 510 is connected to a low temperature optical probe 512 disposed in the probe housing 504. The probe housing 504 includes a spring 514 to provide for vertical movement of the low temperature optical probe 512 so that a probe tip 516 of the low temperature optical probe 512 is configured to contact ESC 103. In one embodiment, which can be combined with other embodiments described herein, the probe tip 516 contacts ESC 103 without penetrating the surface. In another embodiment, which can be combined with other embodiments described herein, shown in FIG. 5B, the probe tip 516 is disposed within ESC 103. In the facility plate 107, a threaded cap 518 surrounds the probe housing 504. The internal portion 520 of the threaded cap 518 is coupled to the probe housing 504 with an internal seal 522. The internal seal 522 allows the probe tip 516 to maintain contact the ESC 103. In one embodiment, which can be combined with other embodiments described herein, the internal seal 522 is the seal assembly 232. In another embodiment, which can be combined with other embodiments described herein, the internal seal 522 is an elastomer seal. In yet another embodiment, which can be combined with other embodiments described herein, the internal seal 522 is an O-ring. The external portion 524 of the threaded cap 518 is coupled to the facility plate 107 with an external seal 526. The external seal 526 seals the probe housing 504 from the vacuum region 222. In one embodiment, which can be combined with other embodiments described herein, the external seal 526 is an O-ring.

In summation, a substrate support assembly that enables cryogenic temperature operation of an ESC so that a substrate disposed thereon is maintained at the cryogenic processing temperature while other surfaces of a processing chamber are maintained at a different temperature is provided. The substrate support assembly is disposed in the process chamber, including an ESC 103, an ESC base assembly 105 coupled to the ESC 103 and a facility plate 107, and an insulator plate 109 coupled to a ground plate 111. A base fluid flowing through the base channel of the ESC base assembly 105 coupled to the ESC 103, in conjunction with resistive heaters 128, enables the ESC base assembly 105 to be maintained at a predetermined cryogenic temperature, which assists in controlling the lateral temperature profile of the ESC 103 so that a substrate 124 disposed on the ESC 103 is uniformly maintained at a cryogenic processing temperature. The facility fluid flowing through the facility channel 234 of the facility plate 107 enables the facility plate 107 to be maintained at the ambient temperature, which assists in maintaining the insulator plate 109 and ground plate 111 at the ambient temperature.

While the foregoing is directed to examples of the present disclosure, other and further examples of the disclosure may be devised without departing from the basic scope thereof, and the scope thereof is determined by the claims that follow.

What is claimed is:
1. A substrate support assembly, comprising:
   an electrostatic chuck (ESC) having a support surface and a bottom surface opposite the support surface, the ESC having a chucking electrode and one or more resistive heaters disposed therein;

an ESC base assembly coupled to the ESC having a base channel disposed therein, the ESC base assembly comprising materials substantially matched to the coefficient of thermal expansion of the ESC;

a facility plate having a facility channel disposed therein, the facility plate comprises a plate portion and a wall portion, the plate portion coupled to the ESC base assembly and the wall portion coupled to the ESC with a seal assembly; and a vacuum region defined by the ESC, the ESC base assembly, the plate portion of the facility plate, the wall portion of the facility plate, and the seal assembly, wherein the vacuum region always maintains a gap between the ESC base assembly and the plate portion of the facility plate.

2. The substrate support assembly of claim 1, further comprising an insulator plate coupled to the facility plate and a ground plate coupled to the insulator plate.

3. The substrate support assembly of claim 1, wherein the ESC base assembly is secured to the ESC with a bonding layer.

4. The substrate support assembly of claim 1, wherein the ESC comprises alumina ($Al_2O_3$) and/or aluminum nitride (AlN) containing materials.

5. The substrate support assembly of claim 1, wherein the base channel having an inlet and an outlet is operable to be connected to a cryogenic chiller in fluid communication with the base channel via a base inlet conduit connected to the inlet of the base channel and a base outlet conduit connected to the outlet of the base channel.

6. The substrate support assembly of claim 1, wherein the facility channel having an inlet and an outlet is operable to be connected to a chiller in fluid communication with the facility channel via a facility inlet conduit connected to the inlet of the facility channel and a facility outlet conduit connected to the outlet of the facility channel.

7. The substrate support assembly of claim 1, wherein the seal assembly comprises a polytetrafluoroethylene (PTFE) body having a helical spring disposed therein to seal the vacuum region at a temperature between about −260 degrees Celsius to about 290 degrees Celsius.

8. The substrate support assembly of claim 7, wherein the helical spring comprises stainless steel, nickel alloy, nickel-chromium alloy, and cobalt-chromium-nickel-molybdenum alloy containing materials.

9. The substrate support assembly of claim 1, wherein the vacuum region comprises a first vacuum channel operable to be connected to a first vacuum conduit in fluid communication with a vacuum source and a second vacuum channel operable to be connected to a second vacuum conduit in fluid communication with the vacuum source to maintain vacuum pressure in the vacuum region independent of a pressure of a processing region of a processing chamber.

10. The substrate support assembly of claim 1, further comprising one or more probe assemblies coupled to a probe controller, each of the one or more probe assemblies comprise a probe tip.

11. The substrate support assembly of claim 10, wherein the probe tip is disposed at a position comprising at least one of:
in the ESC, at the bottom surface of the ESC, or in the ESC base assembly.

12. The substrate support assembly of claim 10, wherein a heater power source of the one or more resistive heaters having a controller is connected to the probe controller.

13. A substrate support assembly, comprising:
an electrostatic chuck (ESC) having a support surface and a bottom surface opposite the support surface, the ESC having a chucking electrode and one or more resistive heaters disposed therein;

an ESC base assembly coupled to the ESC having a base channel disposed therein, the base channel having a base inlet in fluid communication with a jacketed base inlet tube disposed through a facility plate, an insulator plate coupled to the facility plate, and a ground plate coupled to the insulator plate, the base channel having a base outlet in fluid communication with a jacketed base outlet tube disposed through the facility plate, the insulator plate, and the ground plate;

the facility plate comprises a plate portion and a wall portion, the plate portion coupled to the ESC base assembly with one or more screw assemblies and the wall portion coupled to the ESC with a seal assembly, the facility plate having a facility channel disposed therein, the seal assembly comprises a polytetrafluoroethylene (PTFE) body having a helical spring disposed therein; and a vacuum region defined by the ESC, the ESC base assembly, the plate portion of the facility plate, the wall portion of the facility plate, and the seal assembly, wherein the vacuum region always maintains a gap between the ESC base assembly and the plate portion of the facility plate.

14. The substrate support assembly of claim 13, wherein the helical spring comprises stainless steel, nickel alloy, nickel-chromium alloy, and cobalt-chromium-nickel-molybdenum alloy containing materials.

15. The substrate support assembly of claim 13, wherein each of the one or more screw assemblies includes a bolt inserted through a thermal break, a Belleville washer and the facility plate, and into a thread hole of the ESC base assembly, the Belleville washer and bolt force the facility plate against the ESC base assembly.

16. The substrate support assembly of claim 15, wherein a screw cover is coupled to the facility plate over the bolt.

17. A process chamber comprising:
a chamber body having walls and a lid defining a processing region;

a substrate support assembly disposed in the processing region, the substrate support assembly comprises:
an electrostatic chuck (ESC) having a support surface and a bottom surface opposite the support surface, the ESC having a chucking electrode and one or more resistive heaters disposed therein;

an ESC base assembly coupled to the ESC having a base channel disposed therein, the ESC base assembly comprising materials substantially matched to the coefficient of thermal expansion of the ESC;

a facility plate having a facility channel disposed therein, the facility plate comprises a plate portion and a wall portion, the plate portion coupled to the ESC base assembly and the wall portion coupled to the ESC with a seal assembly; and a vacuum region defined by the ESC, the ESC base assembly, the plate portion of the facility plate, the wall portion of the facility plate, and the seal assembly, wherein the vacuum region always maintains a gag between the ESC base assembly and the plate portion of the facility plate.

18. The process chamber of claim 17, further comprising an insulator plate coupled to the facility plate and a ground plate coupled to the insulator plate.

19. The process chamber of claim 17, wherein the ESC comprises alumina ($Al_2O_3$) and/or aluminum nitride (AlN) containing materials.

20. The process chamber of claim 17, wherein the ESC base assembly comprises molybdenum or carbon fiber containing materials.

* * * * *